US010469050B2

(12) United States Patent
Gamble et al.

(10) Patent No.: US 10,469,050 B2
(45) Date of Patent: Nov. 5, 2019

(54) GUIDED ACOUSTIC WAVE DEVICE

(71) Applicant: Qorvo US, Inc., Greensboro, NC (US)

(72) Inventors: Kevin J. Gamble, Winter Garden, FL (US); Benjamin P Abbott, Longwood, FL (US); Alan S. Chen, Windermere, FL (US); Kurt G. Steiner, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 83 days.

(21) Appl. No.: 15/679,467

(22) Filed: Aug. 17, 2017

(65) Prior Publication Data
US 2018/0054179 A1 Feb. 22, 2018

Related U.S. Application Data

(60) Provisional application No. 62/376,973, filed on Aug. 19, 2016.

(51) Int. Cl.
H03H 9/02 (2006.01)
H03H 9/145 (2006.01)
(Continued)

(52) U.S. Cl.
CPC .......... H03H 9/02228 (2013.01); H03H 3/08 (2013.01); H03H 3/10 (2013.01);
(Continued)

(58) Field of Classification Search
CPC ............... H03H 9/145; H03H 9/14535; H03H 9/14538; H03H 9/14541; H03H 9/1457;
(Continued)

(56) References Cited

U.S. PATENT DOCUMENTS 7,576,471 B1  8/2009 Solal
7,939,989 B2  5/2011 Solal et al.
(Continued)

FOREIGN PATENT DOCUMENTS

JP  11-251860 A * 9/1999
JP  2010-166148 A * 7/2010
WO  WO 2015/182522 A1 * 12/2015

OTHER PUBLICATIONS

Abbott, B., et al. "Theoretical Investigation into Spurious Modes Content in SAW Devices with Dielectric Overcoat," Fourth International Symposium on Acoustic Wave Devices for Future Mobile Communication Systems, Mar. 3-5, 2010, pp. 199-209.
(Continued)

Primary Examiner — Barbara Summons
(74) Attorney, Agent, or Firm — Withrow & Terranova, P.L.L.C.

(57) ABSTRACT

An acoustic wave device includes a piezoelectric layer, an interdigital transducer, and a slow wave propagation overlay over a portion of the interdigital transducer. By providing electrode fingers of the interdigital transducer such that a portion of the width thereof is dependent on an electrode period, a desirable wave mode may be maintained in the acoustic wave device. Further, by varying a width of the slow wave propagation overlay based on the electrode period, the desirable wave mode may be further maintained.

23 Claims, 13 Drawing Sheets

(51) Int. Cl.
*H03H 9/58* (2006.01)
*H03H 3/08* (2006.01)
*H03H 3/10* (2006.01)
*H03H 3/04* (2006.01)

(52) U.S. Cl.
CPC .... *H03H 9/02015* (2013.01); *H03H 9/02149* (2013.01); *H03H 9/1457* (2013.01); *H03H 9/14538* (2013.01); *H03H 9/583* (2013.01); *H01L 2224/05001* (2013.01); *H03H 9/02559* (2013.01); *H03H 2003/0435* (2013.01)

(58) Field of Classification Search
CPC ........... H03H 9/14582; H03H 9/02818; H03H 9/02834; H03H 9/02858; H03H 9/02881; H03H 9/02015; H03H 9/02149; H03H 9/02228; H03H 9/02559; H03H 9/583; H03H 3/08; H03H 3/10; H03H 2003/0435; H01L 2224/05001
USPC ............................. 333/193–196; 310/313 B
See application file for complete search history.

(56) References Cited

U.S. PATENT DOCUMENTS

| | | | |
|---|---|---|---|
| 8,294,331 | B2 | 10/2012 | Abbott et al. |
| 2013/0051588 | A1* | 2/2013 | Ruile ...................... H03H 3/08 381/190 |
| 2014/0285287 | A1* | 9/2014 | Komatsu .................. H03H 9/25 333/195 |
| 2017/0047905 | A1* | 2/2017 | Araki ................. H03H 9/02535 |
| 2017/0077902 | A1* | 3/2017 | Daimon ............... H03H 9/6489 |

OTHER PUBLICATIONS

Abbott, B., et al, "Recent Advances in SAW Technology," 2012 International Symposium on Acoustic Wave Devices for Future Mobile Communication Systems, Dec. 6-7, 2012, pp. 73-78.

Mayer, et al. "Low Loss Recursive Filters for Basestation Applications Without Spurious Modes," Proceedings of the 2005 IEEE International Ultrasonics Symposium, Sep. 18-21, 2005, pp. 1061-1064, Doelen Rotterdam, Netherlands.

Nakamura, H., et al. "Suppression of Transverse Mode Spurious in SAW Resonators on a SiO2/Al/LiNbO3 Structure for Wideband CDMA Applications," Proceedings of the 2008 IEEE International Ultrasonics Symposium, Nov. 2-5, 2008, pp. 594-597, Beijing, China.

Solal, M., et al. "Transverse modes suppression and loss reduction for buried electrodes SAW devices," Proceedings of the 2010 IEEE International Ultrasonics Symposium, Oct. 11-14, 2010, pp. 624-628, San Diego, California, USA.

Solal, M., et al. "A method to reduce losses in buried electrodes RF SAW resonators," Proceedings of the 2011 IEEE International Ultrasonics Symposium, Oct. 18-21, 2011, pp. 324-332, Orlando, Florida, USA.

Wilkus, S., et al. "Transverse Mode Compensation of Surface Acoustic Wave Filters," Proceedings of the 1985 IEEE Ultrasonics Symposium, Oct. 16-18, 1985, pp. 43-47.

* cited by examiner

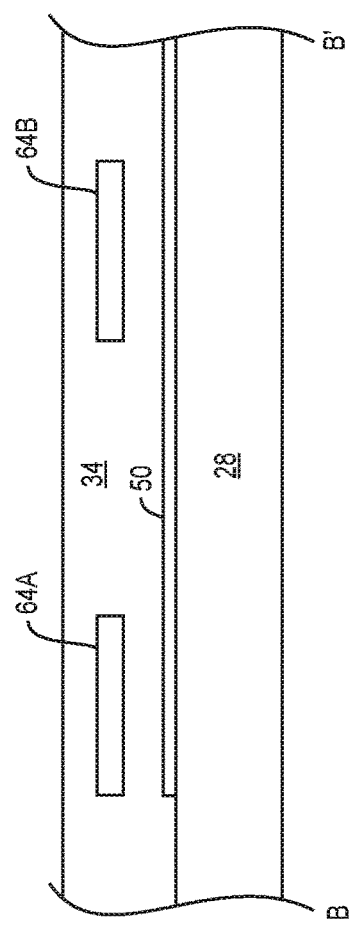
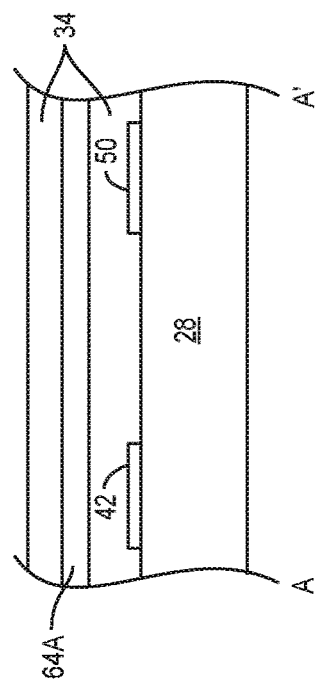
FIG. 12B
FIG. 12A

GUIDED ACOUSTIC WAVE DEVICE

RELATED APPLICATIONS

This application claims the benefit of provisional patent application Ser. No. 62/376,973, filed Aug. 19, 2016, the disclosure of which is hereby incorporated herein by reference in its entirety.

FIELD OF DISCLOSURE

The present disclosure relates to acoustic wave devices, and in particular to guided acoustic wave devices configured to operate in a piston mode with reduced Love mode and transverse mode content.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Exemplary acoustic wave devices include surface acoustic wave (SAW) resonators and bulk acoustic wave (BAW) resonators, which are increasingly used to form filters used in the transmission and reception of RF signals for communication. For purposes of illustration, FIG. 1 shows details of a conventional SAW resonator 10. The conventional SAW resonator 10 includes a piezoelectric layer 12, an interdigital transducer 14 on a surface of the piezoelectric layer 12, a first reflector structure 16A on the surface of the piezoelectric layer 12 adjacent to the interdigital transducer 14, and a second reflector structure 16B on the surface of the piezoelectric layer 12 adjacent to the interdigital transducer 14 opposite the first reflector structure 16A.

The interdigital transducer 14 includes a first interdigital electrode 18A and a second interdigital electrode 18B, each of which include a number of fingers 20 that are interleaved with one another as shown. A distance between adjacent fingers 20 of the first interdigital electrode 18A and the second interdigital electrode 18B defines an electrode period P of the interdigital transducer 14. A ratio between the cross-sectional area along the surface of the piezoelectric layer 12 occupied by the adjacent fingers 20 and the empty space between the adjacent fingers 20 defines a metallization ratio M of the interdigital transducer 14. The electrode period P and the metallization ratio M together characterize the interdigital transducer 14 and may determine one or more operational parameters of the conventional SAW resonator 10. For example, the electrode period P and the metallization ratio M of the interdigital transducer 14, along with other factors such as the properties of the piezoelectric layer 12 may determine a series resonant frequency of the device.

In operation, an alternating electrical input signal provided at the first interdigital electrode 18A is transduced into a mechanical signal in the piezoelectric layer 12, resulting in one or more acoustic waves therein. In the case of the conventional SAW device 10, the resulting acoustic waves are predominately surface acoustic waves. As discussed above, due to the electrode period P and the metallization ratio M of the interdigital transducer 14, the characteristics of the material of the piezoelectric layer 12, and other factors, the magnitude and frequency of the acoustic waves transduced in the piezoelectric layer 12 are dependent on the frequency of the alternating electrical input signal. This frequency dependence is often described in terms of changes in the impedance and/or a phase shift between the first interdigital electrode 18A and the second interdigital electrode 18B with respect to the frequency of the alternating electrical input signal. The acoustic waves transduced by the alternating electrical input signal travel in the piezoelectric layer 12, eventually reaching the second interdigital electrode 18B where they are transduced into an alternating electrical output signal. The first reflector structure 16A and the second reflector structure 16B reflect the acoustic waves in the piezoelectric layer 12 back towards the interdigital electrode 14 to confine the acoustic waves in the area surrounding the interdigital transducer 14.

FIG. 2 is a graph illustrating an ideal relationship of the impedance (shown as admittance) and phase shift between the first interdigital electrode 18A and the second interdigital electrode 18B to the frequency of the alternating electrical input signal for the conventional SAW resonator 10. A solid line 22 illustrates the admittance between the first interdigital electrode 18A and the second interdigital electrode 18B with respect to the frequency of the alternating electrical input signal. Notably, the solid line 22 includes a peak at a first point P1 at which the admittance between the first interdigital electrode 18A and the second interdigital electrode 18B climbs rapidly to a maximum value. This peak occurs at the series resonant frequency ($f_S$) of the conventional SAW resonator 10. The impedance between the first interdigital electrode 18A and the second interdigital electrode 18B at the series resonant frequency is minimal, such that the first interdigital electrode 18A and the second interdigital electrode 18B appear as a short-circuit. The solid line 22 also includes a valley at a second point P2 at which the admittance between the first interdigital electrode 18A and the second interdigital electrode 18B plummets rapidly to a minimum value. This valley occurs at the parallel resonant frequency ($f_P$) of the conventional SAW resonator 10. The impedance between the first interdigital electrode 18A and the second interdigital electrode 18B at the parallel resonant frequency is at a maximum, such that the first interdigital electrode 18A and the second interdigital electrode 18B appear as an open circuit.

A dashed line 24 illustrates the phase shift between the first interdigital electrode 18A and the second interdigital electrode 18B with respect to the frequency of the alternating electrical input signal. Notably, the dashed line shows that a 90° phase shift occurs between the series resonant frequency and the parallel resonant frequency. This phase shift is due to the change in the impedance from primarily capacitive to primarily inductive between the series resonant frequency and the parallel resonant frequency.

While the series resonant frequency and the parallel resonant frequency of the conventional SAW resonator 10 are shown occurring at certain frequencies in the graph, various aspects of the conventional SAW resonator 10, such as the electrode period P and the metallization ratio M of the interdigital transducer 14, the material of the piezoelectric layer 12, and other factors may be modified to raise or lower both the series resonant frequency and the parallel resonant frequency. However, the frequency of the conventional SAW resonator 10 is generally limited due to limits in the velocity of acoustic waves in the piezoelectric layer 12. This in turn limits the utility of the conventional SAW resonator 10, precluding its use in applications requiring processing of high frequency signals above a certain threshold. Further, there are limits in the frequency delta achievable between SAW devices such as the conventional SAW resonator 10 fabricated on the same wafer, such that multi-frequency SAW devices generally must be on different wafers that consume more space in a device.

The graph shown in FIG. 2 is highly idealized. In reality, the response of the conventional SAW resonator 10 includes spurious areas that degrade the performance thereof. Further, the response of the conventional SAW resonator 10 may be temperature dependent, which may be undesirable in many circumstances. There have been numerous developments in the technology in an effort to suppress these spurious responses and temperature compensate devices, however, there is a need for further improvements in these areas.

SUMMARY

In one embodiment, a device includes a piezoelectric layer, a first interdigital electrode, a second interdigital electrode, and a slow wave propagation overlay. The first interdigital electrode is on a surface of the piezoelectric layer and includes a first bus bar parallel to a longitudinal axis and a first set of electrode fingers extending transversely from the first bus bar parallel to a lateral axis. The second interdigital electrode is also on the surface of the piezoelectric layer and includes a second bus bar parallel to the longitudinal axis and a second set of electrode fingers extending transversely from the second bus bar parallel to the lateral axis. The first set of electrode fingers is interleaved with the second set of electrode fingers such that a distance between adjacent electrode fingers measured along the longitudinal axis is varied. The slow wave propagation overlay is over at least a portion of the first set of electrode fingers and the second set of electrode fingers such that a width of the slow wave propagation overlay measured along the lateral axis varies based on the distance between adjacent electrode fingers in the first set of electrode fingers and the second set of electrode fingers located directly beneath the slow wave propagation overlay. By varying the width of the slow wave propagation overlay based on the distance between adjacent electrodes below the overlay, a wave propagation velocity underneath the slow wave propagation overlay can be adjusted to maintain a desirable wave mode in the acoustic wave device.

In one embodiment, a device includes a piezoelectric layer, a first interdigital electrode and a second interdigital electrode. The first interdigital electrode is on a surface of the piezoelectric layer and includes a first bus bar parallel to a longitudinal axis and a first set of electrode fingers extending parallel to a lateral axis perpendicular to the longitudinal axis between the first bus bar and a first electrode finger termination edge. The second interdigital electrode is on the surface of the piezoelectric layer and includes a second bus bar parallel to the longitudinal axis and a second set of electrode fingers extending parallel to the lateral axis between the second bus bar and a second electrode termination edge. The first set of electrode fingers and the second set of electrode fingers are interleaved such that a width measured along the longitudinal axis of a portion of each one of the first set of electrode fingers near the first electrode termination edge is dependent on a distance between the electrode finger and an adjacent one of the second set of electrode fingers and the width is different than a width of a portion of the electrode finger near the first bus bar. Further, a width measured along the longitudinal axis of a portion of each one of the second set of electrode fingers near the second electrode termination edge is dependent on a distance between the electrode finger and an adjacent one of the first set of electrode fingers and the width is different than a width of a portion of the electrode finger near the second bus bar. By changing the width of the electrode fingers near the electrode finger termination edges such that it is dependent on the distance between the electrodes, a wave propagation velocity underneath the slow wave propagation overlay can be adjusted to maintain a desirable wave mode in the acoustic wave device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 12A and 12B illustrate portions of an acoustic wave device according to one embodiment of the present disclosure.

DETAILED DESCRIPTION

Figure 1:
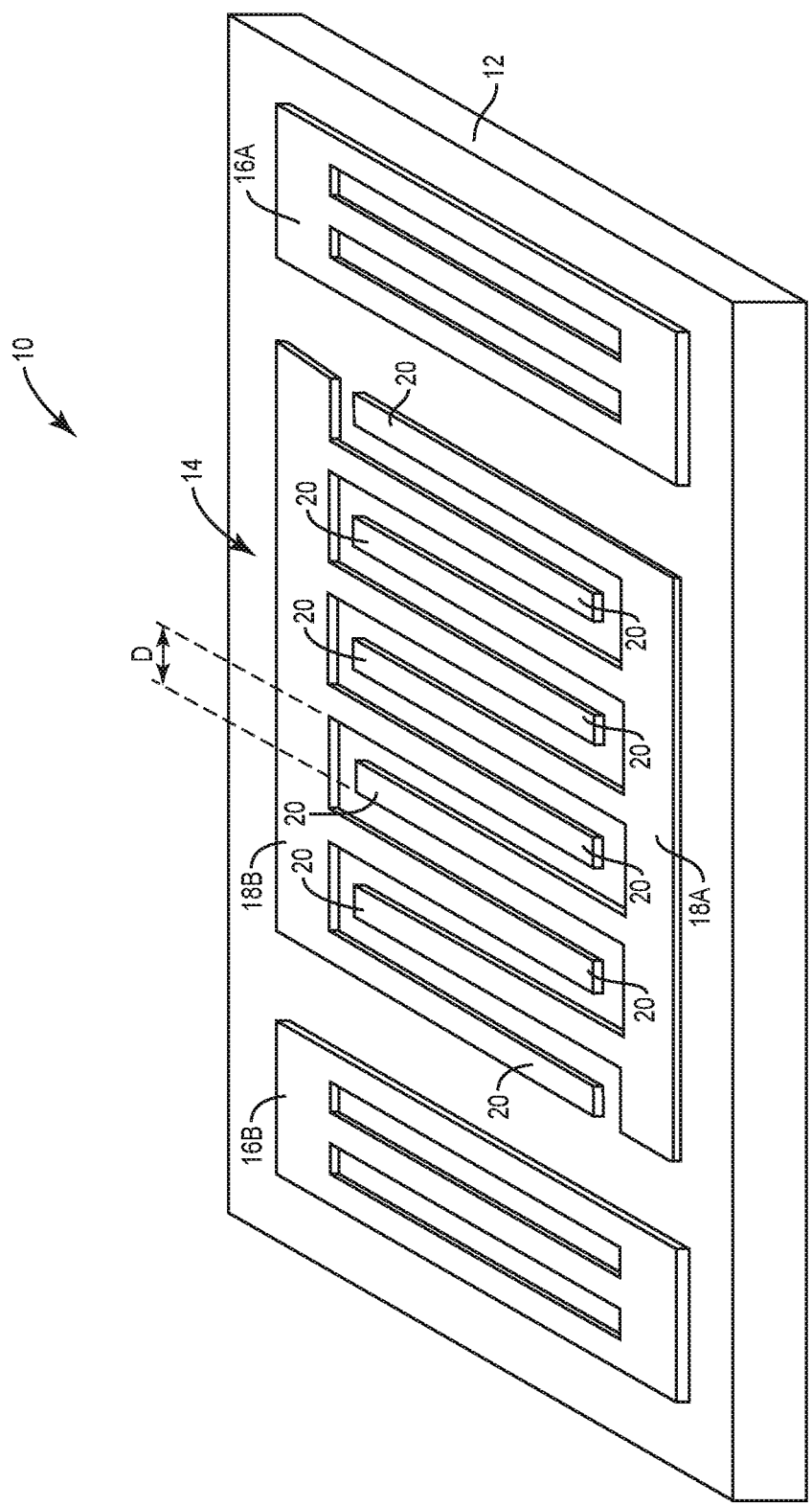
FIG. 1 illustrates a conventional surface acoustic wave (SAW) resonator.
Figure 2:
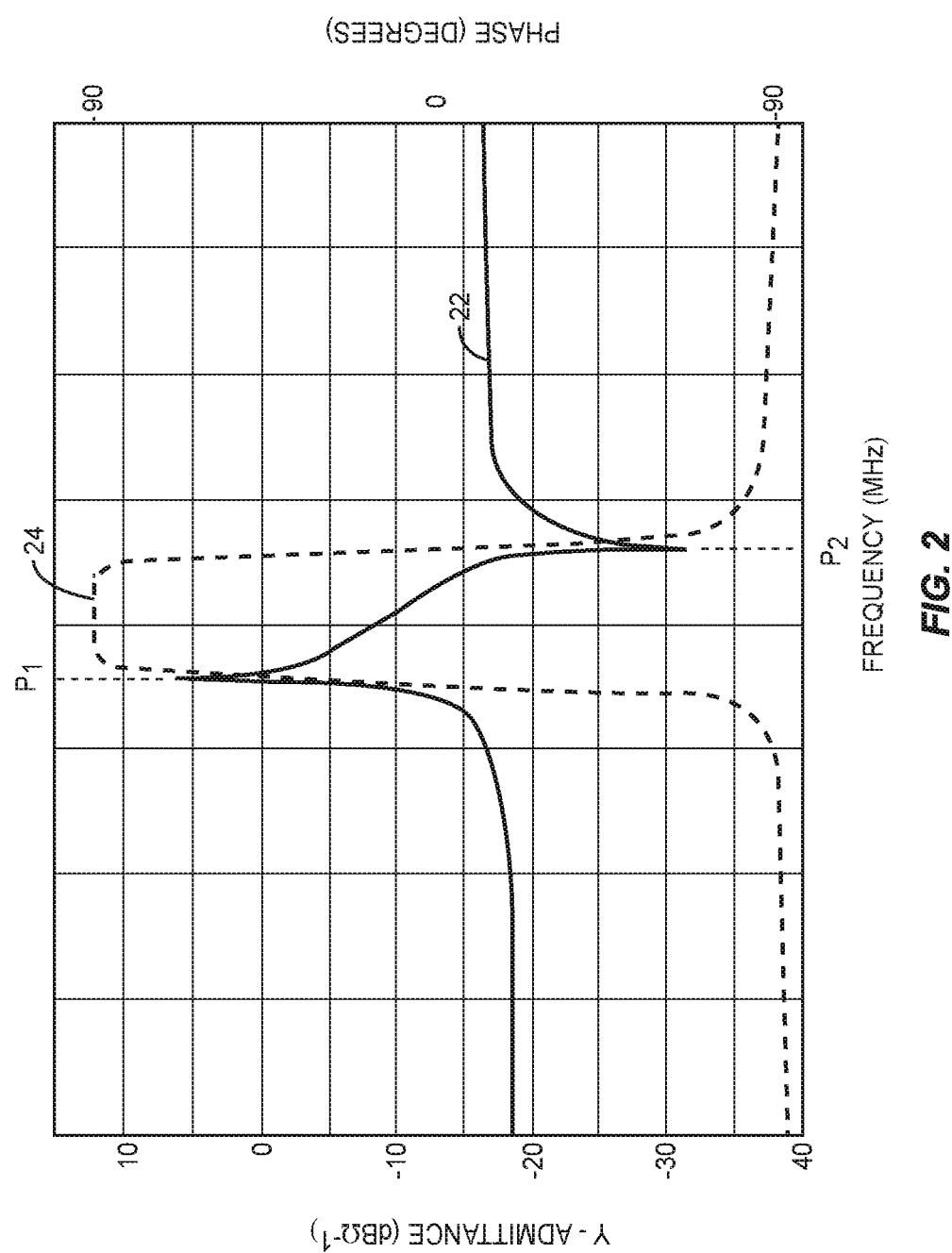
FIG. 2 is a graph illustrating a response of a conventional SAW resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3A:
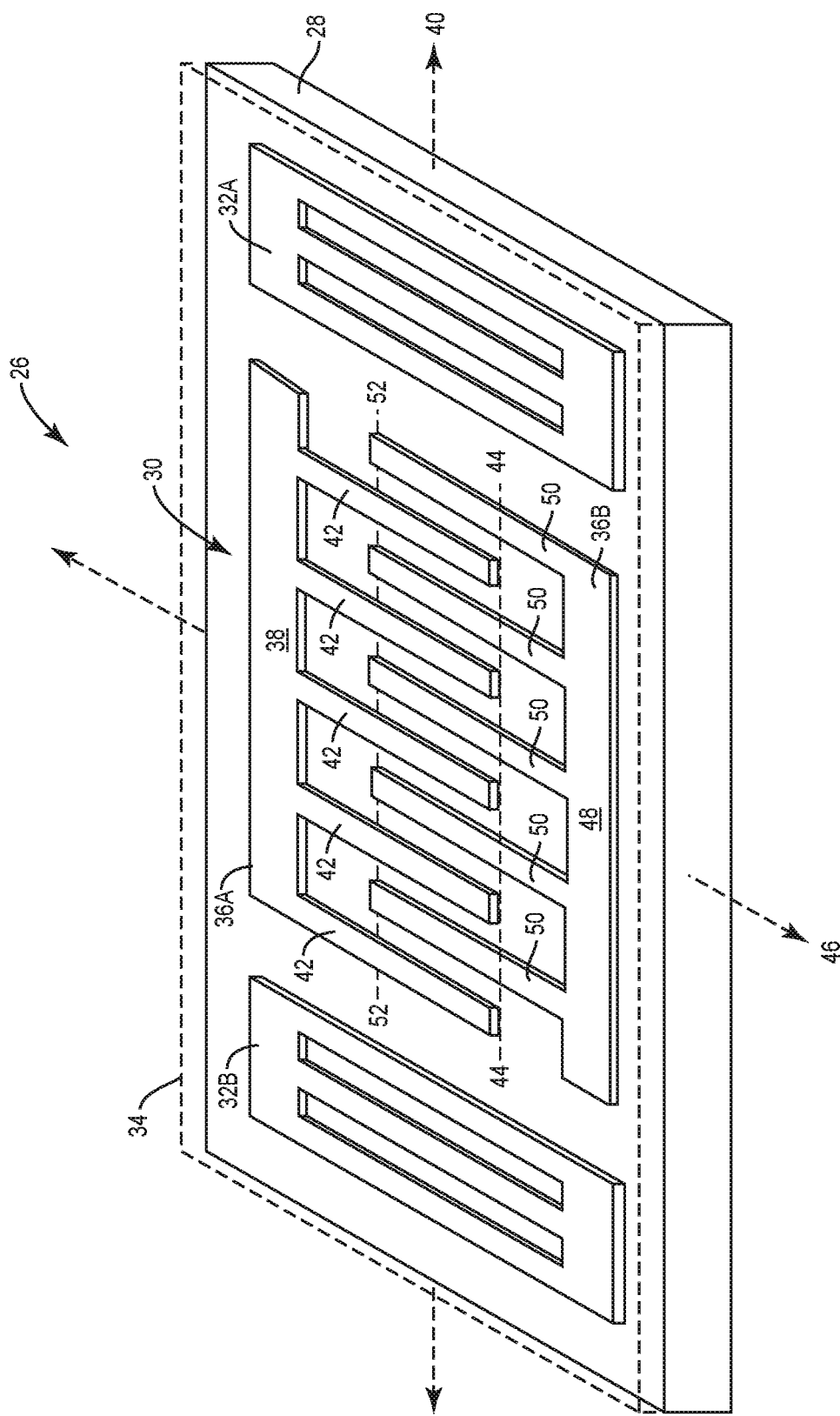
FIGS. 3A and 3B illustrate an acoustic wave device according to one embodiment of the present disclosure.

FIG. 3A shows details of an acoustic wave device 26 according to one embodiment of the present disclosure. The acoustic wave device 26 includes a piezoelectric layer 28, an interdigital transducer 30 on a surface of the piezoelectric layer 28, a first reflector structure 32A on the surface of the piezoelectric layer 28 adjacent to the interdigital transducer 30, a second reflector structure 32B on the surface of the piezoelectric layer 28 adjacent to the interdigital transducer 30 opposite the first reflector structure 32A, and a dielectric layer 34 over the surface of the piezoelectric layer 28, the interdigital transducer 30, the first reflector structure 32A, and the second reflector structure 32B.

The interdigital transducer 30 includes a first interdigital electrode 36A and a second interdigital electrode 36B. The first interdigital electrode 36A includes a first bus bar 38 arranged parallel to a longitudinal axis 40 of the acoustic wave device 26 and a first set of electrode fingers 42, each of which extends transversely from the first bus bar 38 to a first electrode termination edge 44, which is also parallel to the longitudinal axis 40. In other words, each one of the first set of electrode fingers 42 extends parallel to a lateral axis 46 of the acoustic wave device 26, which is perpendicular to the longitudinal axis 40, between the first bus bar 38 and the first electrode termination edge 44. The second interdigital electrode 36B includes a second bus bar 48 arranged parallel to the longitudinal axis 40 and a second set of electrode fingers 50, each of which extends transversely from the second bus bar 48 to a second electrode termination edge 52, which is also parallel to the longitudinal axis 40. In other words, each one of the second set of electrode fingers 50 extends parallel to the lateral axis 46 between the second bus bar 48 and the second electrode termination edge 52.

A distance between adjacent ones of the first set of electrode fingers 42 and the second set of electrode fingers 50 define an electrode period P of the interdigital transducer 30. A ratio between the cross-sectional area along the surface of the piezoelectric layer 28 occupied by the adjacent ones of the first set of electrode fingers 42 and the second set of electrode fingers 50 and the empty space between the adjacent ones of the first set of electrode fingers 42 and the second set of electrode fingers 50 defines a metallization ratio M of the interdigital transducer 30. The electrode period P and the metallization ratio M together characterize the interdigital transducer 30 and may determine one or more operational parameters of the acoustic wave device 26. In the present embodiment, the interdigital transducer 30 is configured to primarily transduce a piston wave in the piezoelectric layer 28, as discussed in detail below.

In operation, an alternating electrical input signal provided at the first interdigital electrode 36A is transduced into a mechanical signal in the piezoelectric layer 28, resulting in one or more acoustic waves, which are desirably piston waves, therein. As discussed above, due to the electrode period P and the metallization ratio M of the interdigital transducer 30, the characteristics of the material of the piezoelectric layer 28, and other factors, the magnitude and frequency of the acoustic waves transduced in the piezoelectric layer 28 are dependent on the frequency of the alternating electrical input signal. This frequency dependence is often described in terms of changes in the impedance and/or a phase shift between the first interdigital electrode 36A and the second interdigital electrode 36B with respect to the frequency of the alternating electrical input signal. The acoustic waves transduced by the alternating electrical input signal travel in the piezoelectric layer 28, eventually reaching the second interdigital electrode 36B where they are transduced into an alternating electrical output signal. The first reflector structure 32A and the second reflector structure 32B reflect the acoustic waves in the piezoelectric layer 28 back towards the interdigital transducer 30 to confine the acoustic waves in the area surrounding the interdigital transducer 30.

Figure 3B:
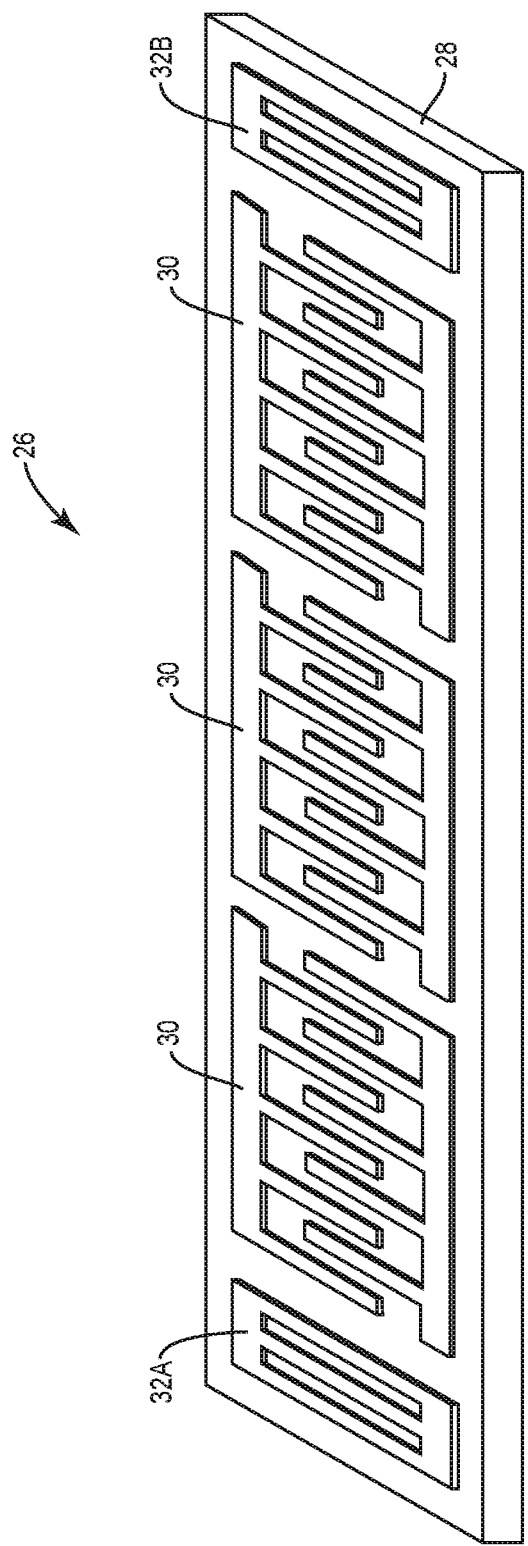

The acoustic wave device 26 shown in FIG. 3A is shown including a single interdigital transducer 30 surrounded by reflector structures 32. However, the principles of the present disclosure may also be applied to coupled resonator filters including several interdigital transducers 30 adjacent to one another and surrounded by reflector structures 32 as illustrated in FIG. 3B. Notably, the configuration of the interdigital transducers 30 shown in FIG. 3B is merely exemplary. Those skilled in the art will appreciate that the interdigital transducers 30 may be arranged in any number of different ways, that the acoustic wave device 26 may include more or less interdigital transducers 30, and that the interdigital transducers 30 may be connected to one another in different configurations, all of which are contemplated herein. For purposes of simplicity, the remaining description focuses on the principles of the present disclosure as they are applied to a single interdigital transducer 30. Those skilled in the art will readily appreciate that these concepts may be applied across interdigital transducers 30 in coupled resonator filters such as the one illustrated in FIG. 3B.

Figure 4:
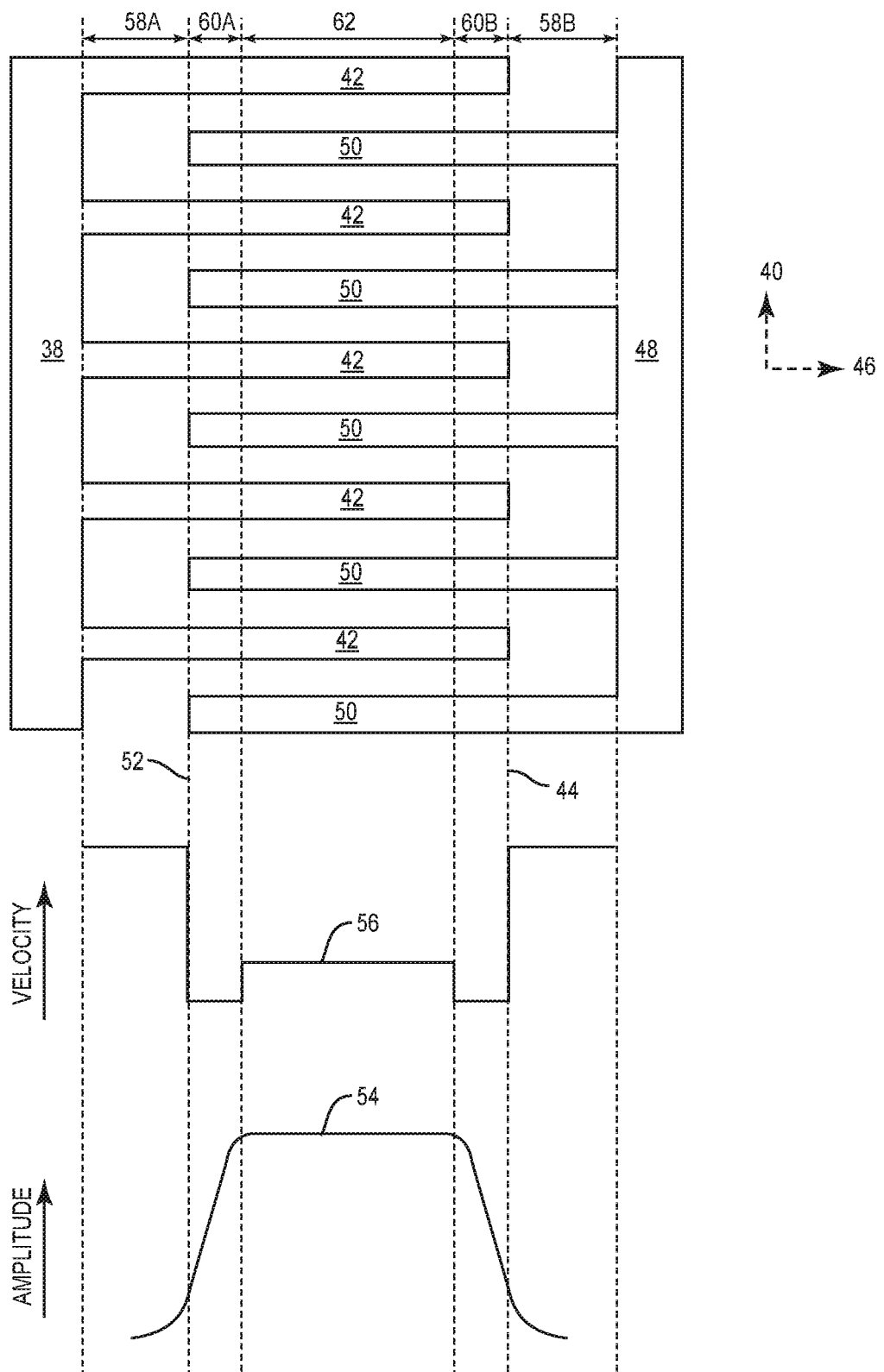
FIG. 4 illustrates an acoustic wave device according to one embodiment of the present disclosure.

FIG. 4 shows a top view of the interdigital transducer 30 according to one embodiment of the present disclosure. Notably, the interdigital transducer 30 is designed to primarily transduce a piston wave in the piezoelectric layer 28, which is illustrated by a wave amplitude plot 54 at the bottom of FIG. 4. A velocity plot 56 illustrates a desired wave velocity in each one of a number of regions defined by the interdigital transducer 30. In particular, a first fast wave propagation region 58A is defined as the area between the first bus bar 38 and the second electrode termination edge 52, a second fast wave propagation region 58B is defined as the area between the second bus bar 48 and the first electrode termination edge 44, a first slow wave propagation region 60A is defined as the area along the second electrode termination edge 52, a second slow wave propagation region 60B is defined as the area along the first electrode termination edge 44, and a waveguide region 62 is defined as the area between the first slow wave propagation region 60A and the second slow wave propagation region 60B. The velocity plot 56 illustrates the desired velocity for wave propagation in each one of the regions. In particular, the velocity plot 56 shows that a nominal velocity is desired in the waveguide region 62, a slow velocity is desired in each one of the first slow wave propagation region 60A and the second slow wave propagation region 60B, and a fast velocity is desired in each one of the first fast wave propagation region 58A and the second fast wave propagation region 58B. The wave amplitude plot 54 illustrates the resulting wave, which has a flat amplitude in the waveguide region 62 that decays trigonometrically in the first slow wave propagation region 60A and the second slow wave propagation region 60B and exponentially in the first fast wave propagation region 58A and the second fast wave propagation region 58B. In other words, the wave amplitude plot 54 illustrates an ideal piston wave.

Figure 5:
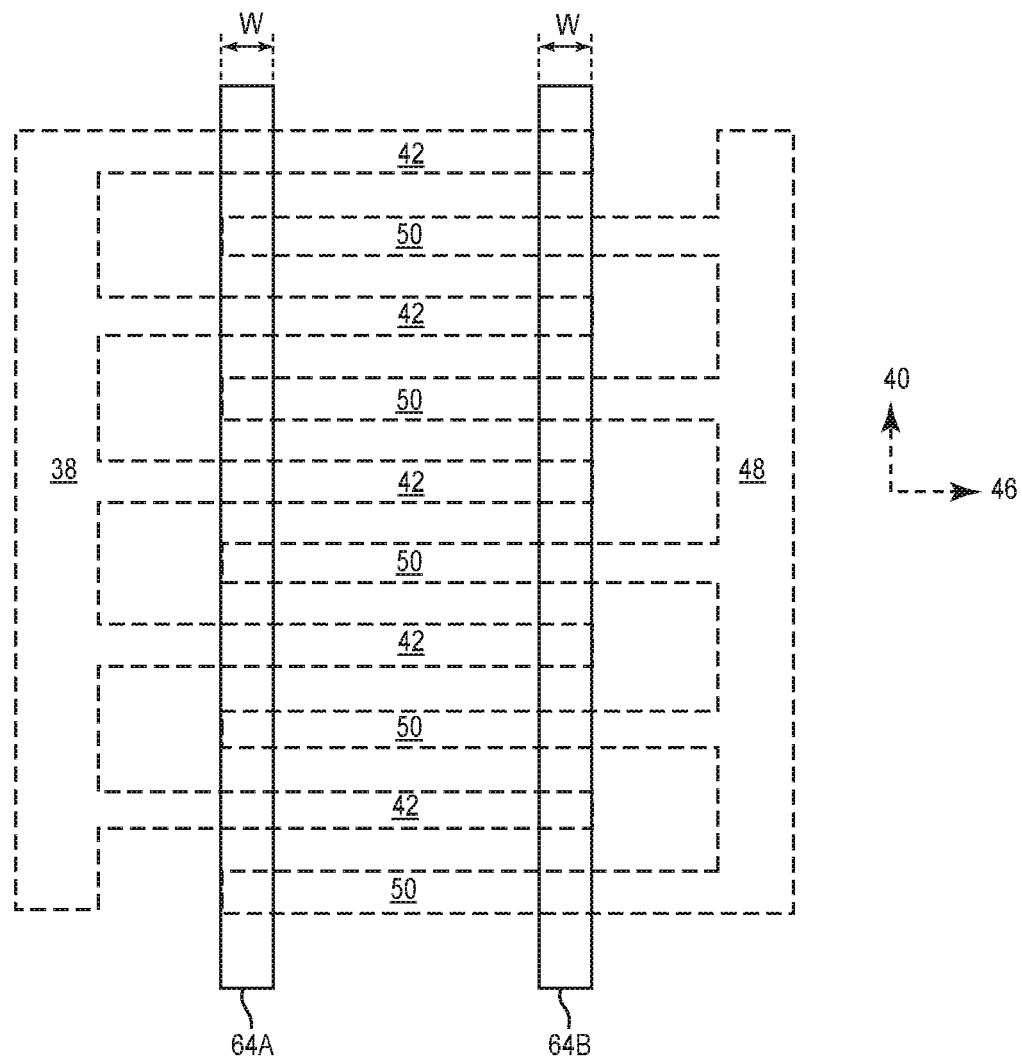
FIG. 5 illustrates an acoustic wave device according to one embodiment of the present disclosure

In addition to providing the interdigital transducer 30 as shown in FIG. 5, the various regions described above may be achieved using overlays on top of the dielectric layer 34. For example, a first slow wave propagation overlay 64A may be provided over the first slow wave propagation region 60A and a second slow wave propagation overlay 64B may be provided over the second slow wave propagation region 60B. As illustrated, the first slow wave propagation overlay 64A and the second slow wave propagation overlay 64B may be provided as stripes with a constant width only over those regions. The material of the first slow wave propagation overlay 64A and the second slow wave propagation overlay 64B may ensure the slow propagation of waves in these regions and thus the interdigital transducer 30 may primarily transduce a piston wave in the piezoelectric layer 28, and specifically in the waveguide region 62.

Figure 6:
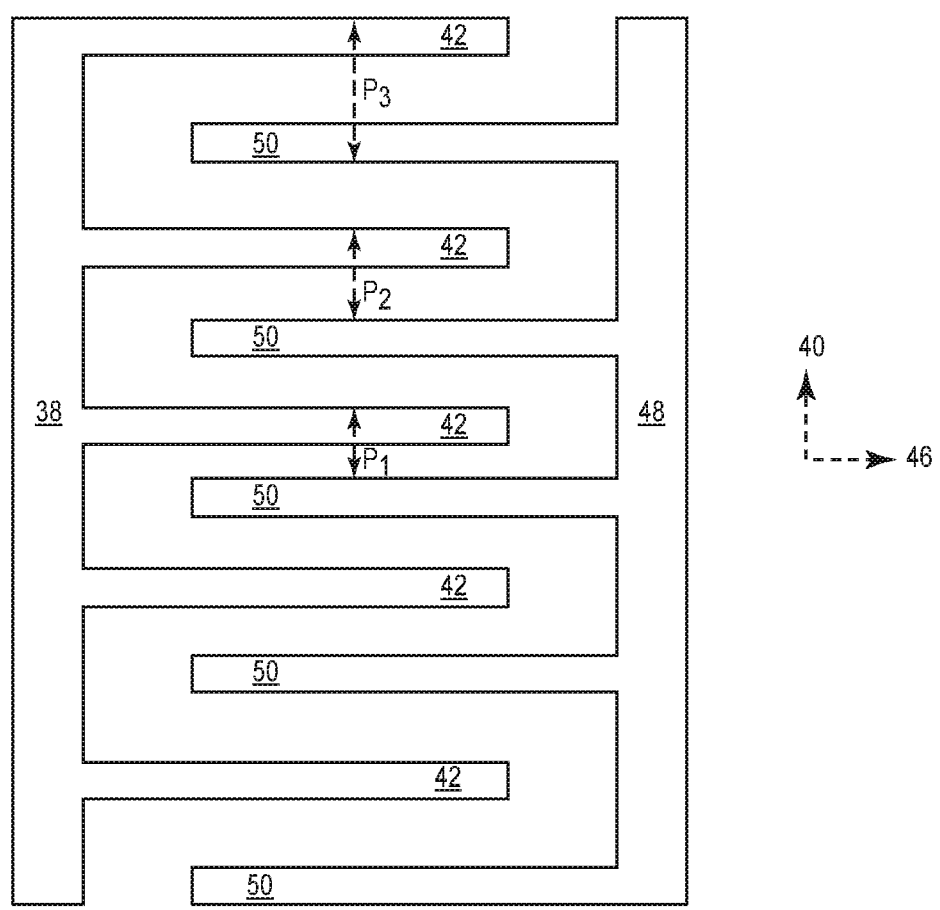
FIG. 6 illustrates an acoustic wave device according to one embodiment of the present disclosure.

While the interdigital transducer 30 is shown in FIGS. 3-5 with a so-called "synchronous" electrode period P that remains constant over the entirety thereof, the electrode period P of the interdigital transducer 30 may also be varied or "asynchronous" in some embodiments, as illustrated in FIG. 6. As shown, a first electrode period $P_1$ of a first one of the first set of electrode fingers 42 and a first one of the second set of electrode fingers 50 may be different from a second electrode period $P_2$ of a second one of the first set of electrode fingers 42 and a second one of the second set of electrode fingers 50 and a third electrode period $P_3$ of a third one of the first set of electrode fingers 42 and a third one of the second set of electrode fingers 50. As illustrated, the electrode period P of adjacent ones of the first set of electrode fingers 42 and the second set of electrode fingers 50 may increase in proportion to a distance from a center of the interdigital transducer 30 about the lateral axis 46. However, such a configuration is only illustrative. Those skilled in the art will appreciate that the electrode period P of the interdigital transducer 30 may be varied in any number of different ways to achieve different objectives, all of which are contemplated herein.

Figure 7:
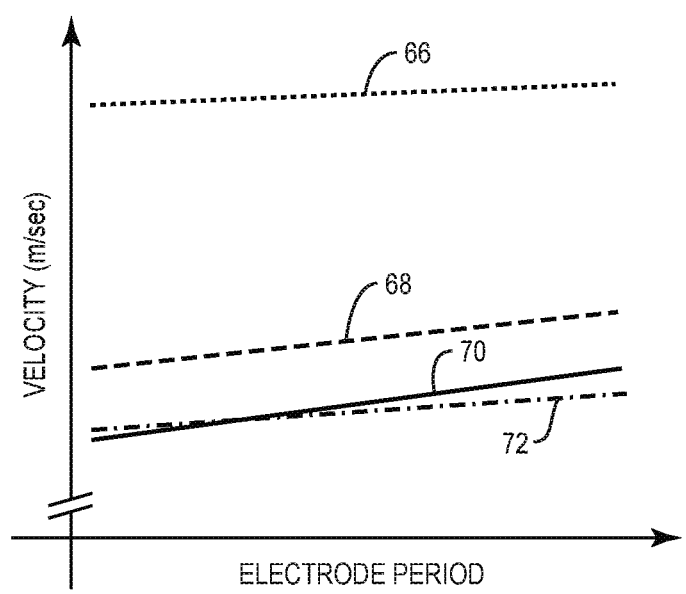
FIG. 7 is a graph illustrating a relationship between wave propagation velocity and electrode period for an acoustic wave device according to one embodiment of the present disclosure.

Changes in the electrode period P generally result in changes in wave propagation velocity in the piezoelectric layer 28, as shown in the graph in FIG. 7, where a dotted line 66 represents the relationship of wave propagation velocity to electrode period P in the first fast wave propagation region 58A and the second fast wave propagation region 58B, a dashed line 68 represents the relationship of wave propagation velocity to electrode period P in the waveguide region 62, and a solid line 70 represents the relationship of wave propagation velocity to electrode period P in the first slow wave propagation region 60A and the second slow wave propagation region 60B. As discussed above, a particular relationship between wave propagation velocities in the various regions is necessary to create the desired piston wave. In some cases, the relationship between wave propagation velocity in one or more regions such as the first slow wave propagation region 60A and the second slow wave propagation region 60B and electrode period P may change at a different rate than another region such as the waveguide region 62. This is illustrated as a difference in slope between the dashed line 68 and the solid line 70 in FIG. 7. Such differences may be undesirable in some circumstances, as they may lead to degradation of the desired piston wave in the piezoelectric layer 28 discussed above and introduction of other wave modes, such as transverse waves and Love waves. Accordingly, a dashed and dotted line 72 is also shown, which represents the ideal relationship between wave propagation velocity and electrode period P for the first slow wave propagation region 60A and the second slow wave propagation region 60B. By achieving such a relationship, the piston mode behavior of the acoustic wave device 26 may be maintained as the electrode period P of the interdigital transducer 30 is varied and spurious responses may be attenuated.

Figure 8:
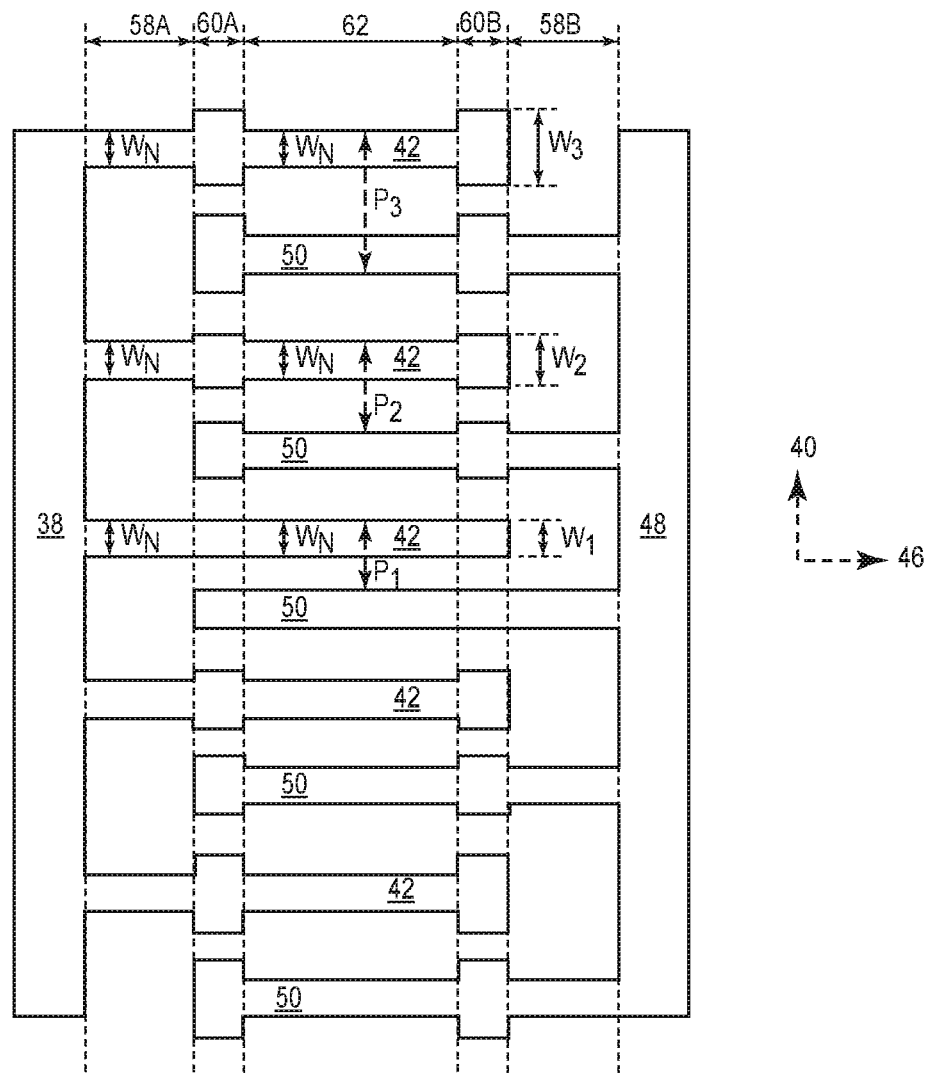
FIG. 8 illustrates an acoustic wave device according to one embodiment of the present disclosure.

Changing the relationship of wave propagation velocity and electrode period P in the first slow wave propagation region 60A and the second slow wave propagation region 60B may be accomplished in several different ways. First, a width W measured along the longitudinal axis 40 of each one of the first set of electrode fingers 42 and the second set of electrode fingers 50 within the first slow wave propagation region 60A and the second slow wave propagation region 60B may be proportional to an electrode period P thereof, as shown in FIG. 8. Notably, a width of the remainder of each one of the first set of electrode fingers 42 and the second set of electrode fingers 50 (i.e., the portion of each one of the electrode fingers within the first fast wave propagation region 58A, the second fast wave propagation region 58B, and the waveguide region 62) is not changed.

In particular, a first one of the first set of electrode fingers 42 and a first one of the second set of electrode fingers 50 have a first electrode period $P_1$, and are each defined by a nominal width $W_N$ and a first width $W_1$. The nominal width $W_N$ is the width measured along the longitudinal axis 40 of each one of the first one of the first set of electrode fingers 42 and the first one of the second set of electrode fingers 50 within the first fast wave propagation region 58A, the second fast wave propagation region 58B, and the waveguide region 62. The first width $W_1$ is the width measured along the longitudinal axis 40 of each one of the first one of the first set of electrode fingers 42 and the first one of the second set of electrode fingers 50 within the first slow wave propagation region 60A and the second slow wave propagation region 60B. The nominal width $W_N$ is not related to the electrode period P of the electrode fingers; however, the first width $W_1$ is as discussed in detail below. In the case of the first one of the first set of electrode fingers 42 and the first one of the second set of electrode fingers 50, the nominal width $W_N$ is shown equal to the first width $W_1$, however, those skilled in the art will appreciate that the first width $W_1$ may be greater than or less than the nominal width $W_N$ in various embodiments.

A second one of the first set of electrode fingers 42 and a second one of the second set of electrode fingers 50 have a second electrode period $P_2$, and are each defined by the nominal width $W_N$ and a second width $W_2$. The nominal width $W_N$ is the width measured along the longitudinal axis 40 of each one of the second one of the first set of electrode fingers 42 and the second one of the second set of electrode fingers 50 within the first fast wave propagation region 58A, the second fast wave propagation region 58B, and the waveguide region 62. The second width $W_2$ is the width measured along the longitudinal axis 40 of each one of the second one of the first set of electrode fingers 42 and the second one of the second set of electrode fingers 50 within the first slow wave propagation region 60A and the second slow wave propagation region 60B. The nominal width $W_N$ is not related to the electrode period P of the electrode fingers; however, the second width $W_2$ is as discussed in detail below. In the case of the second one of the first set of electrode fingers 42 and the second one of the second set of electrode fingers 50, the second width $W_2$ is shown greater than the nominal width $W_N$ and the first width $W_1$, however, those skilled in the art will appreciate that the second width $W_2$ may be greater than or less than the nominal width $W_N$ and the first width $W_1$ in various embodiments.

A third one of the first set of electrode fingers 42 and a third one of the second set of electrode fingers 50 have a third electrode period $P_3$, and are each defined by the nominal width $W_N$ and a third width $W_3$. The nominal width $W_N$ is the width measured along the longitudinal axis 40 of each one of the third one of the first set of electrode fingers 42 and the third one of the second set of electrode fingers 50 within the first fast wave propagation region 58A, the second fast wave propagation region 58B, and the waveguide region 62. The third width $W_3$ is the width measured along the longitudinal axis 40 of each one of the third one of the first set of electrode fingers 42 and the third one of the second set of electrode fingers 50 within the first slow wave propagation region 60A and the second slow wave propagation region 60B. The nominal width $W_N$ is not related to the electrode period P of the electrode fingers; however, the third width $W_3$ is as discussed in detail below. In the case of the third one of the first set of electrode fingers 42 and the third one of the second set of electrode fingers 50, the third width $W_3$ is shown greater than the nominal width $W_N$, the first width $W_1$, and the second width $W_2$, however, those skilled in the art will appreciate that the third width $W_3$ may be greater than or less than the nominal width $W_N$, the first width $W_1$, and the second width $W_2$ in various embodiments.

Figure 9B:
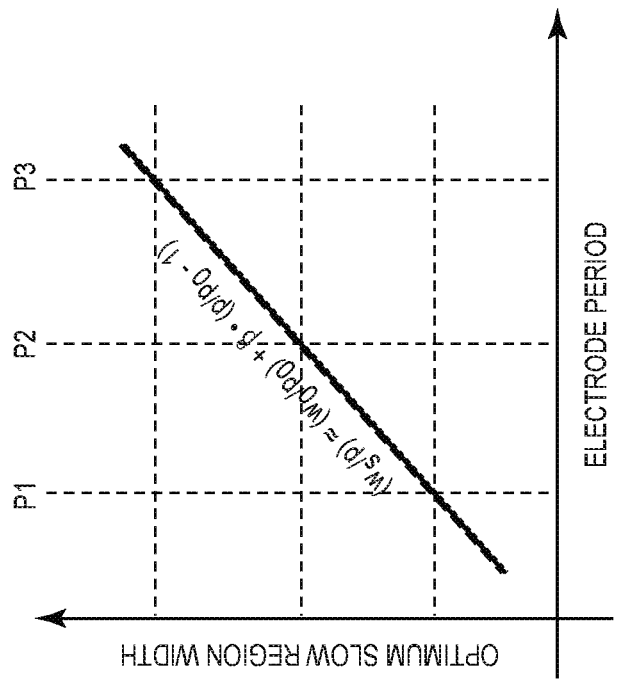
FIGS. 9A and 9B are graphs illustrating a relationship between passband ripple and electrode finger width for an acoustic wave device according to one embodiment of the present disclosure.
Figure 9A:
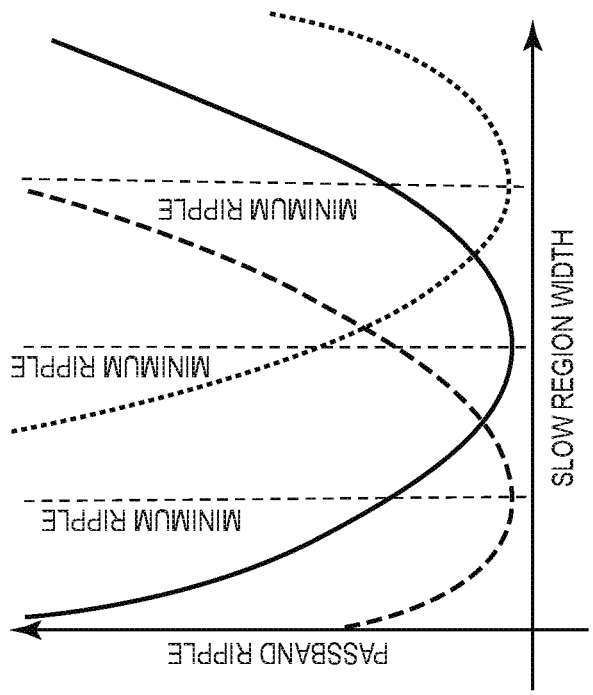

The particular relationship of the width of the portion of each one of the first set of electrode fingers 42 and the second set of electrode fingers 50 in the first slow wave propagation region 60A and the second slow wave propagation region 60B to the electrode period P thereof may be chosen to minimize passband ripple in the acoustic wave device 26. Accordingly, FIG. 9A illustrates an exemplary relationship of the width of the portion of each one of the first set of electrode fingers 42 and the second set of electrode fingers 50 in the first slow wave propagation region 60A and the second slow wave propagation region 60B to passband ripple for a first electrode period $P_1$, a second electrode period $P_2$, and a third electrode period $P_3$. FIG. 9B illustrates an exemplary relationship of the width of the portion of each one of the first set of electrode fingers 42 and the second set of electrode fingers 50 in the first slow wave propagation region 60A and the second slow wave propagation region 60B providing the lowest passband ripple to the electrode period P. By drawing a line through the width of the portion of each one of the first set of electrode fingers 42 and the second set of electrode fingers 50 in the first slow wave propagation region 60A and the second slow wave propagation region 60B providing the lowest passband ripple for each electrode period P, an equation can be derived for the optimal relationship between the width of the portion of each one of the first set of electrode fingers 42 and the second set of electrode fingers 50 in the first slow wave propagation region 60A and the second slow wave propagation region 60B and the electrode period P in which passband ripple is minimized, as in Equation (1):

$$\frac{W_X}{P_X} \approx \frac{W_M}{P_M} + \beta \times \left(\frac{P_X}{P_M} - 1\right) \tag{1}$$

where $W_X$ is the width of a portion of an electrode finger within the first slow wave propagation region 60A and the second slow wave propagation region 60B to be calculated, $P_X$ is the electrode period of the electrode finger whose width is being calculated, $W_M$ is the median width of all of the electrode fingers within the first slow wave propagation region 60A and the second slow wave propagation region 60B, $P_M$ is the median electrode period of all of the electrode fingers, and $\beta$ is a constant. In various embodiments, $\beta$ may be between $$0.5 \times \frac{W_M}{P_M} \text{ and } 2.0 \times \frac{W_M}{P_M}.$$

Notably, only the portion of the electrode fingers in the first set of electrode fingers 42 and the second set of electrode fingers 50 that is within the first slow wave propagation region 60A and the second slow wave propagation region 60B is modified such that it is dependent on the electrode period P. The remaining portions of the electrode fingers in the first set of electrode fingers 42 and the second set of electrode fingers 50 is defined by the nominal width $W_N$, which is not dependent on the electrode period P.

Providing the first set of electrode fingers 42 and the second set of electrode fingers 50 as discussed above effectively modifies the relationship between electrode period P and wave propagation velocity in the first slow wave propagation region 60A and the second slow wave propagation region 60B such that it is closer to the ideal discussed above with respect to FIG. 7. Accordingly, the piston mode of the acoustic wave device 26 may be emphasized while reducing other modes such as transverse modes and Love modes that lead to spurious responses of the device.

Figure 10:
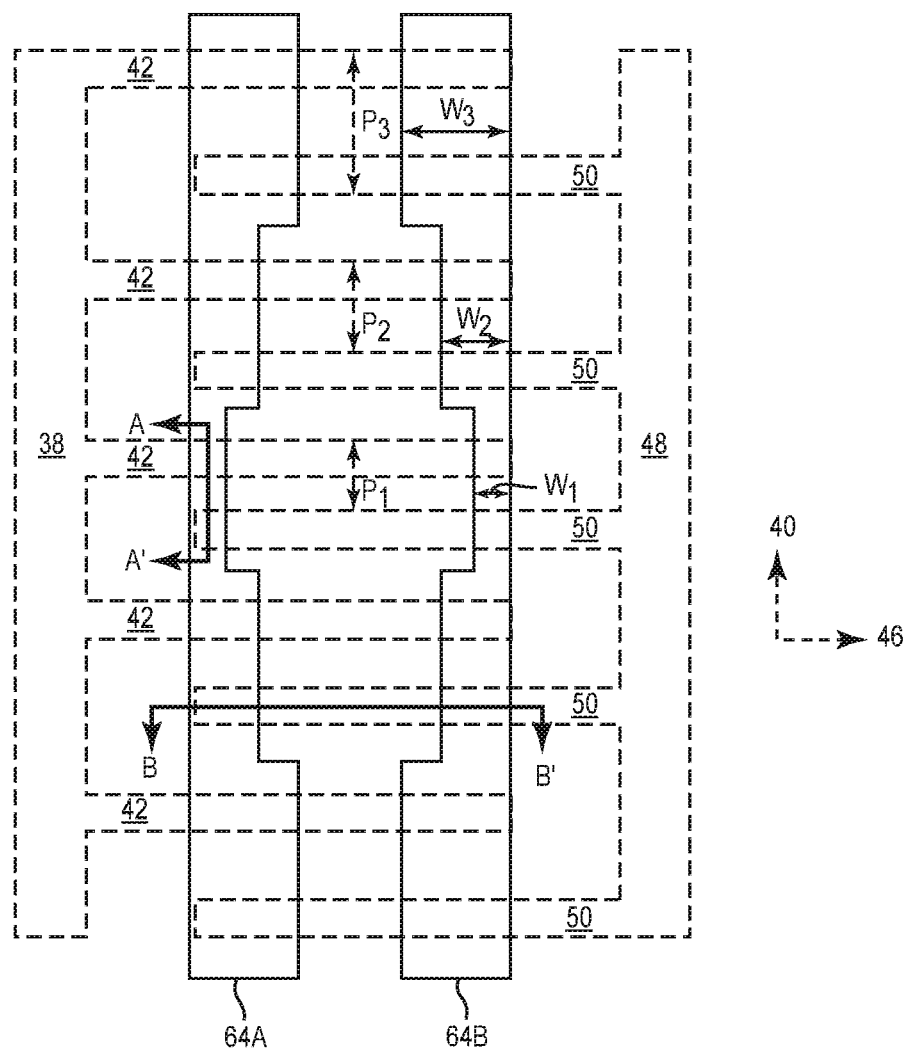
FIG. 10 illustrates an acoustic wave device according to one embodiment of the present disclosure.

FIG. 10 illustrates an additional way to modify the relationship between electrode period P and wave propagation velocity in the first slow wave propagation region 60A and the second slow wave propagation region 60B. As illustrated, a width W of each one of the first slow wave propagation overlay 64A and the second slow wave propagation overlay 64B measured along the lateral axis 46 may be modified such that it is dependent on the electrode period P of the electrode fingers in the first set of electrode fingers 42 and the second set of electrode fingers 50 directly below the overlay. In particular, in the area of the first slow wave propagation region 60A and the second slow wave propagation region 60B directly over the first one of the first set of electrode fingers 42 and the second set of electrode fingers 50 (with the first electrode period $P_1$), the first slow wave propagation overlay 64A and the second slow wave propagation overlay 64B may have a first width $W_1$. In the area of the first slow wave propagation region 60A and the second slow wave propagation region 60B directly over the second one of the first set of electrode fingers 42 and the second one of the second set of electrode fingers 50 (with the second electrode period $P_2$), the first slow wave propagation overlay 64A and the second slow wave propagation overlay 64B may have a second width $W_2$. In the area of the first slow wave propagation region 60A and the second slow wave propagation region 60B directly over the third one of the first set of electrode fingers 42 and the third one of the second set of electrode fingers 50 (with the third electrode period $P_3$), the first slow wave propagation overlay 64A and the second slow wave propagation overlay 64B may have a third width $W_3$. As shown, the third width $W_3$ is greater than the second width $W_2$ which is in turn greater than the first width $W_1$ such that the width of the first slow wave propagation overlay 64A and the second slow wave propagation overlay 64B is positively proportional to the electrode period P. Those skilled in the art will appreciate that this may not always be the case, however. The relationship between the width of the first slow wave propagation overlay 64A and the second slow wave propagation overlay 64B may be positively proportional, negatively proportional, or otherwise without departing from the principles herein.

In one embodiment, the relationship of the width of the first slow wave propagation overlay 64A and the second slow wave propagation overlay 64B to the electrode period P may be defined as in Equation (2):

$$\frac{W_X}{P_X} \approx \frac{W_M}{P_M} + \alpha \times \left(\frac{P_X}{P_M} - 1\right) \quad (2)$$

where $W_X$ is the width of the portion of the first slow wave propagation overlay 64A and the second slow wave propagation overlay to be calculated, $P_X$ is the electrode period of the electrode finger directly below the portion of the first slow wave propagation overlay 64A and the second slow wave propagation overlay 64B, $W_M$ is the median width of the first slow wave propagation overlay 64A and the second slow wave propagation overlay 64B, $P_M$ is the median electrode period for the electrode fingers, and α is a constant. In various embodiments, α may be between 0 and 1.0.

Providing the first slow wave propagation overlay 64A and the second slow wave propagation overlay 64B as discussed above effectively modifies the relationship between electrode period P and wave propagation velocity in the first slow wave propagation region 60A and the second slow wave propagation region 60B such that it is closer to the ideal discussed above with respect to FIG. 7. Accordingly, the piston mode of the acoustic wave device 26 may be emphasized while reducing other modes such as transverse modes and Love modes that lead to spurious responses of the device.

Notably, the approaches shown in FIGS. 8 and 10 may be combined, such that both the width of the electrode fingers within the first slow wave propagation region 60A and the second slow wave propagation region 60B is dependent on the electrode period P and the width of the first slow wave propagation overlay 64A and the second slow wave propagation overlay 64B is dependent on the electrode period P. Such an approach may further modify the relationship between electrode period P and wave propagation velocity in the first slow wave propagation region 60A and the second slow wave propagation region 60B such that it is even closer to the ideal discussed above with respect to FIG. 7. Accordingly, the piston mode of the acoustic wave device 26 may be emphasized while reducing other modes such as transverse modes and Love modes.

Figure 11B:
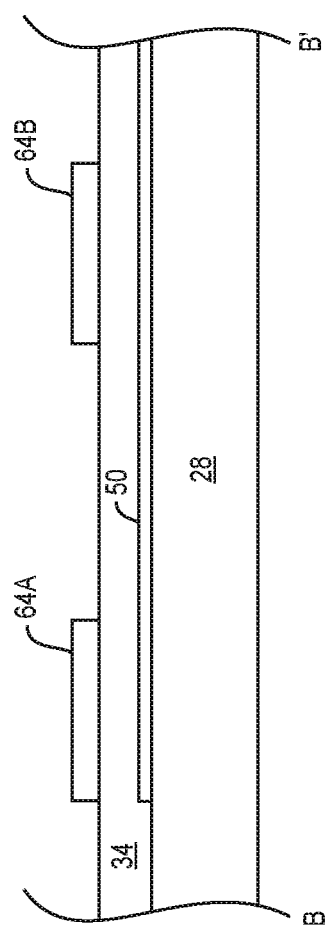
FIGS. 11A and 11B illustrate portions of an acoustic wave device according to one embodiment of the present disclosure.
Figure 11A:
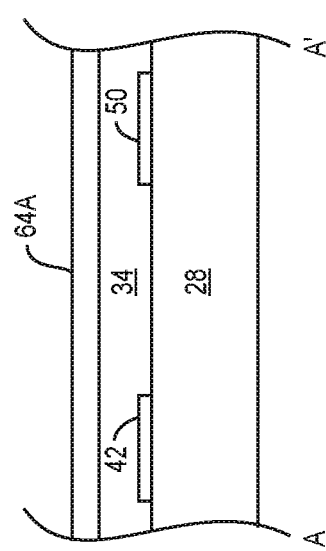

FIG. 11A illustrates a cross-section of the acoustic wave device 26 through A-A' shown in FIG. 9. The cross-section includes the piezoelectric layer 28, the first one of the first set of electrode fingers 42 on the piezoelectric layer 28, the first one of the second set of electrode fingers 50 on the piezoelectric layer 28, the dielectric layer 34 over the piezoelectric layer 28, the first one of the first set of electrode fingers 42 and the first one of the second set of electrode fingers 50, and the first slow wave propagation overlay 64A over the dielectric layer.

FIG. 11B illustrates a cross-section of the acoustic wave device 26 through B-B' shown in FIG. 10. The cross-section includes the piezoelectric layer 28, one of the second set of electrode fingers 50 on the piezoelectric layer 28, the dielectric layer 34 over the piezoelectric layer 28 and the one of the second set of electrode fingers 50, the first slow wave propagation overlay 64A over the dielectric layer 34, and the second slow wave propagation overlay 64B over the dielectric layer 34. Notably, additional dielectric and/or functional layers may be present on or under the piezoelectric layer 28, the dielectric layer 34, or both according to various embodiments of the present disclosure.

While not shown, additional dielectric layers may be provided between the dielectric layer 34 and the piezoelectric layer 28 as well as over the dielectric layer 34. In particular, a frequency trimming layer may be provided over all or a portion of the first slow wave propagation overlay 64A, the second slow wave propagation overlay 64B, and the dielectric layer 34 in order to modify a frequency response of the acoustic wave device 26.

In various embodiments, the piezoelectric layer 28 may comprise lithium niobate or any other suitable piezoelectric material. Further, the piezoelectric layer 28 may be an offset cut of lithium niobate such as 128° YX cut lithium niobate. A thickness of the piezoelectric layer 28 may be between 1 µm and 500 µm. The interdigital transducer 30 may comprise any suitable evaporated or sputtered metal stack. The dielectric layer 34 may comprise silicon dioxide or any other suitable dielectric material and have a thickness between 5000 Angstroms and 2.0 µm. As discussed above, additional dielectric layers or other functional layers may be provided between the dielectric layer 34 and the piezoelectric layer 28 or on top of the dielectric layer 34 opposite the piezoelectric layer. For example, a frequency trimming layer may be provided over the dielectric layer 34, and in particular over a center and edge region of the interdigital transducer 30. The frequency trimming layer may comprise silicon nitride or any other suitable material. The first slow wave propagation overlay 64A and the second slow wave propagation overlay 64B may comprise a metal or a dielectric material.

FIG. 12A illustrates a cross-section of the acoustic wave device 26 through A-A' shown in FIG. 9 according to an additional embodiment of the present disclosure. The cross-section of the acoustic wave device 26 shown in FIG. 12A is substantially similar to that shown in FIG. 11A, except that the first slow wave propagation layer 64A and the second slow wave propagation layer 64B are suspended in the dielectric layer 34 rather than provided on top of it.

FIG. 12B illustrates a cross-section of the acoustic wave device 26 through B-B' shown in FIG. 10. Similar to FIG. 12A above, the cross section of the acoustic wave device 26 shown in FIG. 12B is substantially similar to that shown in FIG. 11B, except that the first slow wave propagation layer 64A is suspended in the dielectric layer 34 rather than on top of it.

While not shown, additional dielectric layers may be provided between the dielectric layer 34 and the piezoelectric layer 28 as well as over the dielectric layer 34. In particular, a frequency trimming layer may be provided over all or a portion of the dielectric layer 34 in order to modify a frequency response of the acoustic wave device 26.

Those skilled in the art will recognize improvements and modifications to the preferred embodiments of the present disclosure. All such improvements and modifications are considered within the scope of the concepts disclosed herein and the claims that follow.

What is claimed is:
1. A device comprising:
a piezoelectric layer;
a first interdigital electrode on a surface of the piezoelectric layer and comprising:
a first bus bar parallel to a longitudinal axis; and
a first plurality of electrode fingers extending transversely from the first bus bar parallel to a lateral axis;
a second interdigital electrode on the surface of the piezoelectric layer and comprising:
a second bus bar parallel to the longitudinal axis; and
a second plurality of electrode fingers extending transversely from the second bus bar parallel to the lateral axis and interleaved with the first plurality of electrode fingers such that a distance between adjacent electrode fingers in the first plurality of electrode fingers and the second plurality of electrode fingers measured along the longitudinal axis is varied; and
a slow wave propagation overlay that is continuous over at least a portion of the first plurality of electrode fingers and the second plurality of electrode fingers such that a width of the slow wave propagation overlay measured along the lateral axis varies based on the distance between adjacent electrode fingers in the first plurality of electrode fingers and the second plurality of electrode fingers located directly beneath the slow wave propagation overlay.

2. The device of claim 1 wherein the first interdigital electrode and the second interdigital electrode form an interdigital transducer configured to transduce a piston wave in the piezoelectric layer.

3. The device of claim 2 further comprising a dielectric layer over the surface of the piezoelectric layer, the first interdigital electrode, and the second interdigital electrode such that the slow wave propagation overlay is on a surface of the dielectric layer opposite the piezoelectric layer.

4. The device of claim 1 further comprising a dielectric layer over the surface of the piezoelectric layer, the first interdigital electrode, and the second interdigital electrode such that the slow wave propagation overlay is suspended in the dielectric layer.

5. The device of claim 1 further comprising a dielectric layer over the surface of the piezoelectric layer, the first interdigital electrode, and the second interdigital electrode such that the slow wave propagation overlay is on a surface of the dielectric layer opposite the piezoelectric layer.

6. The device of claim 1 wherein the slow wave propagation overlay is configured to substantially confine an acoustic wave transduced in the piezoelectric layer to a waveguide region.

7. The device of claim 1 wherein:
each of the first plurality of electrode fingers extends between the first bus bar and a first electrode finger termination edge;
each of the second plurality of electrode fingers extends between the second bus bar and a second electrode finger termination edge;
a first fast wave propagation region is defined between the first bus bar and the second electrode finger termination edge;
a second fast wave propagation region is defined between the second bus bar and the first electrode finger termination edge;
a first slow wave propagation region is defined along the first electrode finger termination edge;
a second slow wave propagation region is defined along the second electrode finger termination edge; and
a waveguide region is defined between the first slow wave propagation region and the second slow wave propagation region.

8. The device of claim 7 wherein the slow wave propagation overlay comprises a first slow wave propagation overlay over the first slow wave propagation region and a second slow wave propagation overlay over the second slow wave propagation region.

9. The device of claim 8 wherein the slow wave propagation overlay is configured to substantially confine an acoustic wave transduced in the piezoelectric layer to the waveguide region.

10. The device of claim 8 wherein the first interdigital electrode and the second interdigital electrode form an interdigital transducer configured to transduce a piston wave in the piezoelectric layer.

11. The device of claim 8 further comprising a dielectric layer over the surface of the piezoelectric layer, the first interdigital electrode, and the second interdigital electrode such that the slow wave propagation overlay is on a surface of the dielectric layer opposite the piezoelectric layer.

12. The device of claim 1 further comprising a dielectric layer over the surface of the piezoelectric layer, the first interdigital electrode, and the second interdigital electrode such that at least a portion of the dielectric layer is between the slow wave propagation overlay and the piezoelectric layer.

13. A device comprising:
a piezoelectric layer;
a first interdigital electrode on a surface of the piezoelectric layer and comprising:
   a first bus bar parallel to a longitudinal axis; and
   a first plurality of electrode fingers extending parallel to a lateral axis perpendicular to the longitudinal axis between the first bus bar and a first electrode finger termination edge;
a second interdigital electrode on the surface of the piezoelectric layer and comprising:
   a second bus bar parallel to the longitudinal axis; and
   a second plurality of electrode fingers extending parallel to the lateral axis between the second bus bar and a second electrode finger termination edge and interleaved with the first plurality of electrode fingers such that:
      a width measured along the longitudinal axis of a portion of each one of the first plurality of electrode fingers near the first electrode finger termination edge is dependent on a distance between the one of the first plurality of electrode fingers and an adjacent one of the second plurality of electrode fingers and is different than a width of a portion of the one of the first plurality of electrode fingers near the first bus bar; and
      a width measured along the longitudinal axis of a portion of each one of the second plurality of electrode fingers near the second electrode finger termination edge is dependent on a distance between the one of the second plurality of electrode fingers and an adjacent one of the first plurality of electrode fingers and is different than a width of a portion of the one of the second plurality of electrode fingers near the second bus bar; and
a dielectric layer over the surface of the piezoelectric layer, the first interdigital electrode, and the second interdigital electrode.

14. The device of claim 13 wherein the first interdigital electrode and the second interdigital electrode form an interdigital transducer configured to transduce a piston wave in the piezoelectric layer.

15. The device of claim 13 wherein a period defined by a distance between adjacent electrode fingers of the plurality of first electrode fingers and the plurality of second electrode fingers is variable along the longitudinal axis.

16. The device of claim 13 wherein:
a first fast wave propagation region is defined between the first bus bar and the second electrode finger termination edge;
a second fast wave propagation region is defined between the second bus bar and the first electrode finger termination edge;
a first slow wave propagation region is defined along the first electrode finger termination edge;
a second slow wave propagation region is defined along the second electrode finger termination edge; and
a waveguide region is defined between the first slow wave propagation region and the second slow wave propagation region.

17. The device of claim 16 wherein the portion of each one of the first plurality of electrode fingers near the first electrode finger termination edge is the portion of each one of the first plurality of electrode fingers located in the first slow wave propagation region and the portion of each one of the second plurality of electrode fingers near the second electrode finger termination edge is the portion of each one of the second plurality of electrode fingers located in the second slow wave propagation region.

18. The device of claim 17 wherein the first interdigital electrode and the second interdigital electrode form an interdigital transducer configured to transduce a piston wave in the piezoelectric layer.

19. The device of claim 17 further comprising:
a first slow wave propagation overlay suspended in the dielectric layer over the first slow wave propagation region; and
a second slow wave propagation overlay suspended in the dielectric layer over the second slow wave propagation region, wherein the first slow wave propagation overlay and the second slow wave propagation overlay are configured to substantially confine an acoustic wave transduced in the piezoelectric layer to the waveguide region.

20. The device of claim 17, further comprising:
a first slow wave propagation overlay on a surface of the dielectric layer opposite the piezoelectric layer over the first slow wave propagation region; and
a second slow wave propagation overlay on the surface of the dielectric layer opposite the piezoelectric layer over the second slow wave propagation region, wherein the first slow wave propagation overlay and the second slow wave propagation overlay are configured to substantially confine an acoustic wave transduced in the piezoelectric layer to the waveguide region.

21. The device of claim 20 wherein a width of the first slow wave propagation overlay and the second slow wave propagation overlay measured along the lateral axis varies based on the distance between adjacent electrode fingers in the first plurality of electrode fingers and the second plurality of electrode fingers located directly beneath the first slow wave propagation overlay and the second slow wave propagation overlay.

22. A device comprising:
a piezoelectric layer;
a plurality of interdigital transducers on the piezoelectric layer, each of the plurality of interdigital transducers comprising:
   a first interdigital electrode on a surface of the piezoelectric layer and comprising:
      a first bus bar parallel to a longitudinal axis; and
      a first plurality of electrode fingers extending transversely from the first bus bar parallel to a lateral axis;
   a second interdigital electrode on the surface of the piezoelectric layer and comprising:
      a second bus bar parallel to the longitudinal axis; and
      a second plurality of electrode fingers extending transversely from the second bus bar parallel to the lateral axis and interleaved with the first plurality of electrode fingers such that a distance between adjacent electrode fingers in the first plurality of electrode fingers and the second plurality of electrode fingers measured along the longitudinal axis is varied; and a slow wave propagation overlay that is continuous over at least a portion of the first plurality of electrode fingers and the second plurality of electrode fingers of each one of the plurality of interdigital transducers such that a width of the slow wave propagation overlay measured along the lateral axis varies based on the distance between adjacent electrode fingers in the first plurality of electrode fingers and the second plurality of electrode fingers located directly beneath the slow wave propagation overlay for each one of the plurality of interdigital transducers.

23. The device of claim 22 further comprising a dielectric layer over the surface of the piezoelectric layer, the first interdigital electrode, and the second interdigital electrode such that the slow wave propagation overlay is on a surface of the dielectric layer opposite the piezoelectric layer.

\* \* \* \* \*